United States Patent [19]

Kim

[11] Patent Number: 5,497,202
[45] Date of Patent: Mar. 5, 1996

[54] AUTOMATIC DIGITAL FREQUENCY CONTROL CIRCUIT

[75] Inventor: Ji-ho Kim, Seoul, Rep. of Korea

[73] Assignee: Samsung Electronics Co., Ltd., Kyungki, Rep. of Korea

[21] Appl. No.: 402,945

[22] Filed: Mar. 13, 1995

[30] Foreign Application Priority Data

Mar. 11, 1994 [KR] Rep. of Korea .................. 94-4803

[51] Int. Cl.[6] ........................... H04N 5/12; H03L 7/00
[52] U.S. Cl. ............................ 348/536; 348/540
[58] Field of Search ...................... 348/536, 540, 348/541, 542, 546, 537, 497, 498, 499; H04N 5/12

[56] References Cited

U.S. PATENT DOCUMENTS

| | | | |
|---|---|---|---|
| 4,186,560 | 8/1987 | Balaban et al. | 348/540 |
| 4,675,724 | 6/1987 | Wagner | 348/498 |
| 4,694,326 | 9/1987 | Demmer | 348/540 |
| 4,694,327 | 9/1987 | Demmer | 348/540 |
| 4,989,073 | 1/1991 | Wagner | 348/498 |
| 5,418,573 | 5/1995 | Basile et al. | 348/536 |

Primary Examiner—James J. Groody
Assistant Examiner—Michael H. Lee
Attorney, Agent, or Firm—Sughrue, Mion, Zinn, Macpeak & Seas

[57] ABSTRACT

An automatic digital frequency control circuit is used for processing a digital video signal. The control circuit includes a phase difference calculator, which samples an analog horizontal sync signal and generates a phase difference value between the corrected phase values with respect to a present scanning line and a phase value of a previous scanning line of which the error values are corrected when a digital horizontal sync signal is obtained, and a phase difference accumulator, which accumulates the phase difference value from the phase difference calculator to a phase difference accumulated value which has been already stored therein. The control circuit also includes an oscillation step corrector, which generates correction step data, a phase value generator, which increases the stored phase value by the corrected oscillation step data whenever the system clock is applied thereto and stores and outputs the increased phase value, and a carrier generator, which generates a carrier having a frequency corresponding to the phase value generated in the phase value generator. It will be noted that since the carrier used for processing the digital video signal is digitally generated, a compact system can be obtained while the difficulty in designing a voltage controlled oscillator which limits digitization of the system is resolved.

18 Claims, 3 Drawing Sheets

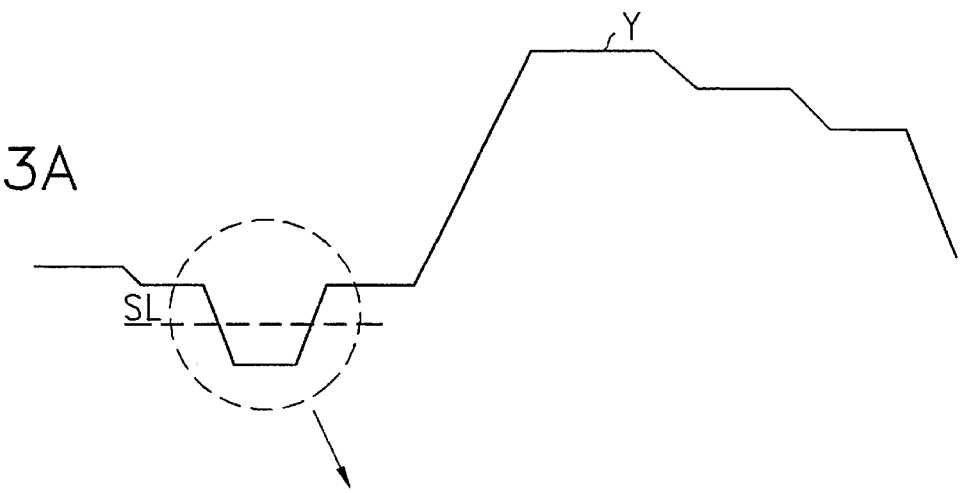
FIG. 3A
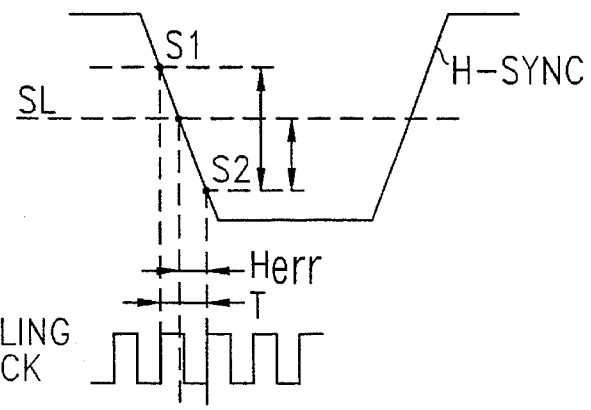
FIG. 3B
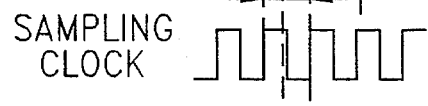
FIG. 3C SAMPLING CLOCK
FIG. 3D DIGITAL Hsync2
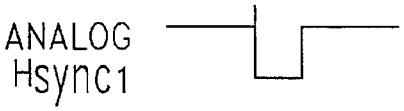
FIG. 3E ANALOG Hsync1

AUTOMATIC DIGITAL FREQUENCY CONTROL CIRCUIT

BACKGROUND OF THE INVENTION

1. Field of the Invention

The present invention relates to an automatic digital frequency control circuit adapted for use in a digital video signal processing apparatus and, more specifically, to an automatic digital frequency control circuit capable of generating a frequency signal which is synchronized to a horizontal sync signal without oscillating a separate comparison frequency by using a phase locked loop circuit.

The instant application is based on Korean Patent Application No. 94-4803, which is incorporated herein by reference for all purposes.

2. Description of the Related Art

A video cassette recorder generally converts a carrier chrominance signal to a low-band frequency and records the converted signal on tape. A low-band carrier frequency in which the phase is synchronized to a horizontal sync signal is required to convert the carrier chrominance signal to the low-band frequency. The low-band carrier frequency is approximately $40f_H$ (=629KHz) for VHS (Video Home System) recording, and $47.25f_H$ (=743KHz) for 8 mm recording, respectively, as compared with a horizontal sync signal frequency $f_H$. Thus, an automatic frequency control circuit needs to precisely generate a low-band carrier frequency of 40 cycles (VHS standard) or 47.25 cycles (8 mm system) every scanning line.

As shown in FIG. 1, a circuit for generating a low-band carrier frequency, which is synchronized to a horizontal sync signal, in an analog video signal processing circuit includes a phase locked loop circuit. In FIG. 1, a horizontal sync separator 10 separates a horizontal sync signal HD from an input luminance signal and supplies the separated horizontal sync signal HD to a phase comparator 20. Phase comparator 20 generates a control direct-current (DC) voltage and supplies the control DC voltage to a voltage controlled oscillator (VCO) 30, which generates a signal $F_1$ and supplies signal $F_1$ to a first frequency divider 40. First frequency divider 40 frequency-divides signal $F_1$ by a factor of four (4), to generate a signal $F_2$ and a low-band carrier frequency signal. A second frequency divider 50 receives signal $F_2$ and frequency-divides received signal $F_2$ by 40, to generate a signal $F_3$. Phase comparator 20 generates the control DC voltage based on a phase comparison result between horizontal sync signal HD and signal $F_3$.

The operation of the apparatus depicted in FIG. 1 will now be described below for the exemplary case wherein the circuit is employed in a VHS apparatus.

When a luminance signal of a color video signal is input to horizontal sync separator 10, a horizontal sync signal HD is separated from the luminance signal and output to phase comparator 20. Phase comparator 20 compares the phase of signal $F_3$, applied from second frequency divider 50, with that of horizontal sync signal HD and generates the control DC voltage corresponding to the phase difference between the respective signals. The control DC voltage is supplied to VCO 30 and is used for controlling the oscillating frequency. During initial operation, VCO 30 generates signal $F_1$ having a frequency of $160f_H$; first frequency divider 40 generates signal $F_2$ having a frequency of $40f_H$; and second frequency divider 50 generates signal $F_3$ having a frequency of $f_H$. It will be noted that, if control DC voltage signal is generated according to the phase difference of signal $F_3$ and horizontal sync signal HD, the frequency of signal $F_1$ generated by VCO 30 is varied. Accordingly, the frequencies of signals $F_2$ and $F_3$ are also varied. If VCO 30 generates signal $F_1$ in which the frequency is varied according to the magnitude of control DC voltage, first frequency divider 40 receives signal $F_1$ and generates signal $F_2$ which is synchronized to horizontal sync signal HD. Then, second frequency divider 50 receives signal $F_2$ and generates signal $F_3$ which is synchronized to horizontal sync signal HD. Signal $F_2$ generated in first frequency divider 40 is supplied to a carrier converter (not shown) and is used as a low-band carrier signal in which the phase is synchronized to horizontal sync signal HD.

In the analog circuit as described above, VCO 30 is used to generate a high frequency signal and the oscillated signal is down-converted to a lower frequency signal in order to obtain a desired frequency signal. However, the above-described operating method cannot be adapted to a digital circuit, since the VCO 30 cannot be used. Additionally, it is difficult to generate a high frequency signal using a digital circuit. Since the signal processing method for many video cassette recorders have been recently changed from analog to digital processing, if a low-band carrier frequency generating algorithm which is used in an existing analog system, is adapted to a digital circuit for recording a chrominance signal as it is, a volume of the circuitry becomes prohibitively large.

SUMMARY OF THE INVENTION

Therefore, the principal object of the present invention is to solve the above problems of the prior art.

An object of the present invention is to provide an automatic frequency control circuit capable of digitally performing signal processing for automatic frequency control.

These and other objects, feature and advantages of the present invention are provided by an automatic digital frequency control circuit for generating a carrier signal which is synchronized to a digital horizontal sync signal. The automatic digital frequency control circuit advantageously includes:

a phase difference calculator for calculating and outputting a phase difference signal between two adjacent scanning lines in response to an error value of a digital horizontal sync signal with respect to a present scanning line and a phase value of a previous scanning line;

a phase difference accumulator for receiving the phase difference signal supplied from the phase difference calculator and accumulating the respective received phase difference signals to thereby generate a phase difference accumulated value which has been already stored therein and outputting a respective newly obtained phase difference accumulated value resulting from the accumulation operation;

an oscillation step corrector generating fundamental oscillation step data, correcting the fundamental oscillation step data using correction step data generated according to the phase difference accumulated value supplied from the phase difference accumulator, and generating corrected oscillation step data;

a phase value generator receiving the corrected oscillation step data, increasing a phase value which has been already stored therein in units representing the corrected oscillation data, generating a phase value for carrier signal generation with respect to the present scanning line, and supplying the plurality of the generated phase values to the phase difference calculator; and a carrier signal generator for generating the respective carrier signal having a frequency corresponding to each respective one of the phase values generated by the phase value generator.

BRIEF DESCRIPTION OF THE DRAWINGS

The preferred embodiments are described with reference to the drawings wherein:

FIGS. 3A through 3E are signal waveform diagrams which find use in explaining detection of a digital horizontal sync signal and generation of an error thereof.

DETAILED DESCRIPTION OF THE PREFERRED EMBODIMENT

A preferred embodiment of the present invention will be described below in more detail with reference to the accompanying drawings FIGS. 2 and 3A through 3E.

As previously discussed, the low-band carrier frequency necessary for converting a carrier chrominance signal into a low-band signal should be phase-synchronized to the horizontal sync signal. That is, in case of an 8 mm system which uses a low-band carrier frequency of $47.25f_H$, the 47.25 low-band carrier frequency signals should be exactly generated with respect to every scanning line, while in case of the VHS system which uses a low-band carrier frequency of $40f_H$, the 40 low-band carrier frequency signals should be exactly generated with respect to every scanning line.

If the difference between phase values of the low-band carrier signals which are detected in the same locations of both one line and the next adjacent line is obtained, it is possible to detect a phase error value. If oscillation of the low-band carrier signal is controlled using the detected phase error value, a low-band carrier signal having a frequency close to an ideal value advantageously can be generated.

On the other hand, sampling is necessarily required to convert an analog signal into a digital signal, i.e., a discrete signal. During a sampling process using a sampling clock of a predetermined frequency, a value between the samples comes to be ignored. While this does not matter in general video data, it becomes very significant in sampling a sync signal, which is a processing reference signal for the video data, particularly since an automatic frequency control circuit for generating a carrier is sensitive to an error of one clock of a horizontal sync signal. Thus, an error value between a point of time at which an actual analog horizontal sync signal is generated and that at which a digital horizontal sync signal is obtained by sampling the analog horizontal sync signal becomes crucial information. When the automatic frequency control circuit ignores such an error value and adopts only a digital horizontal sync signal as a reference signal for a data processing, an error which occurs due to such a reason is present. Accordingly, the circuit does not operate exactly and the performance is thereby reduced.

Figure 1:
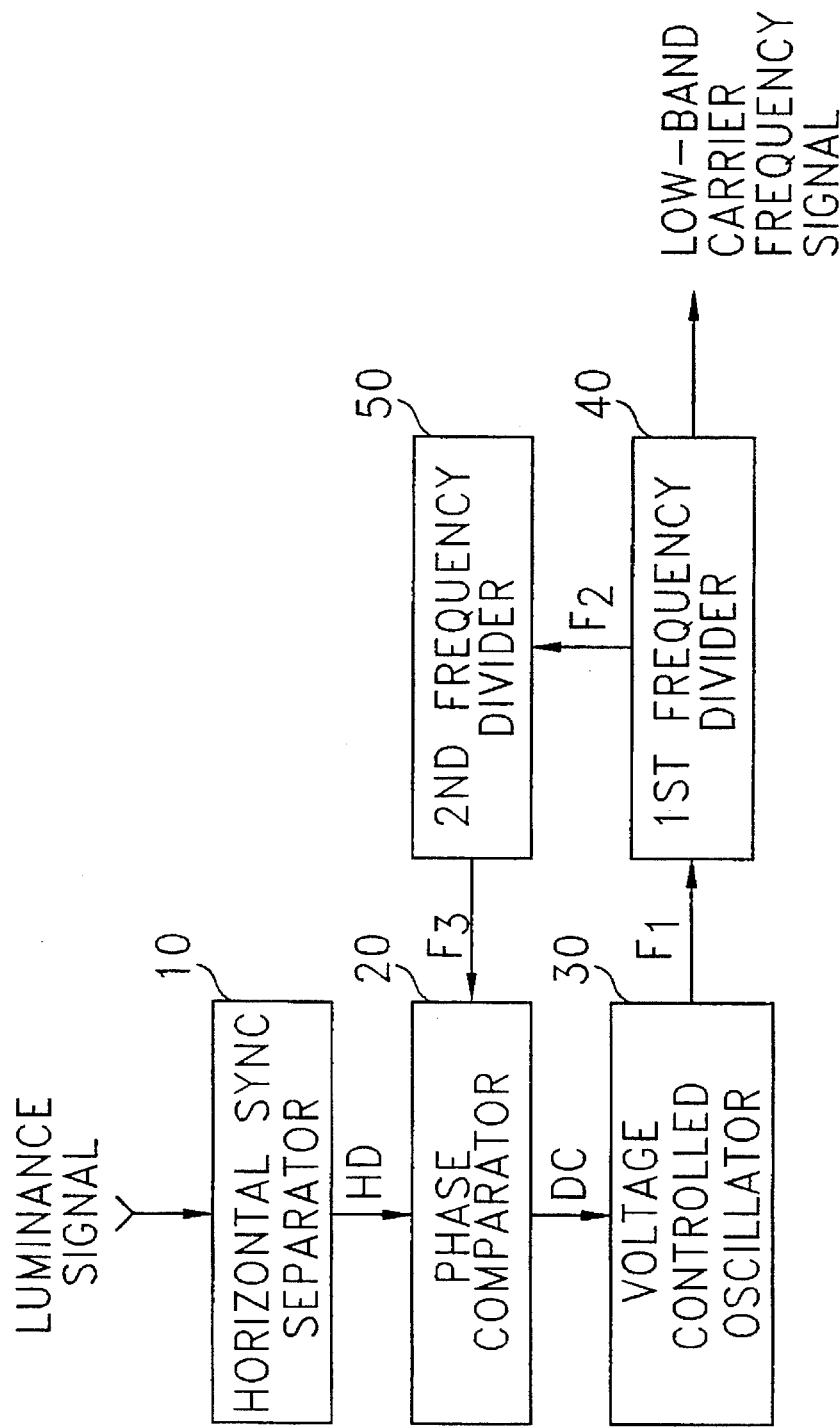
FIG. 1 is a block diagram of a conventional automatic frequency control circuit using a phase locked loop circuit.
Figure 2:
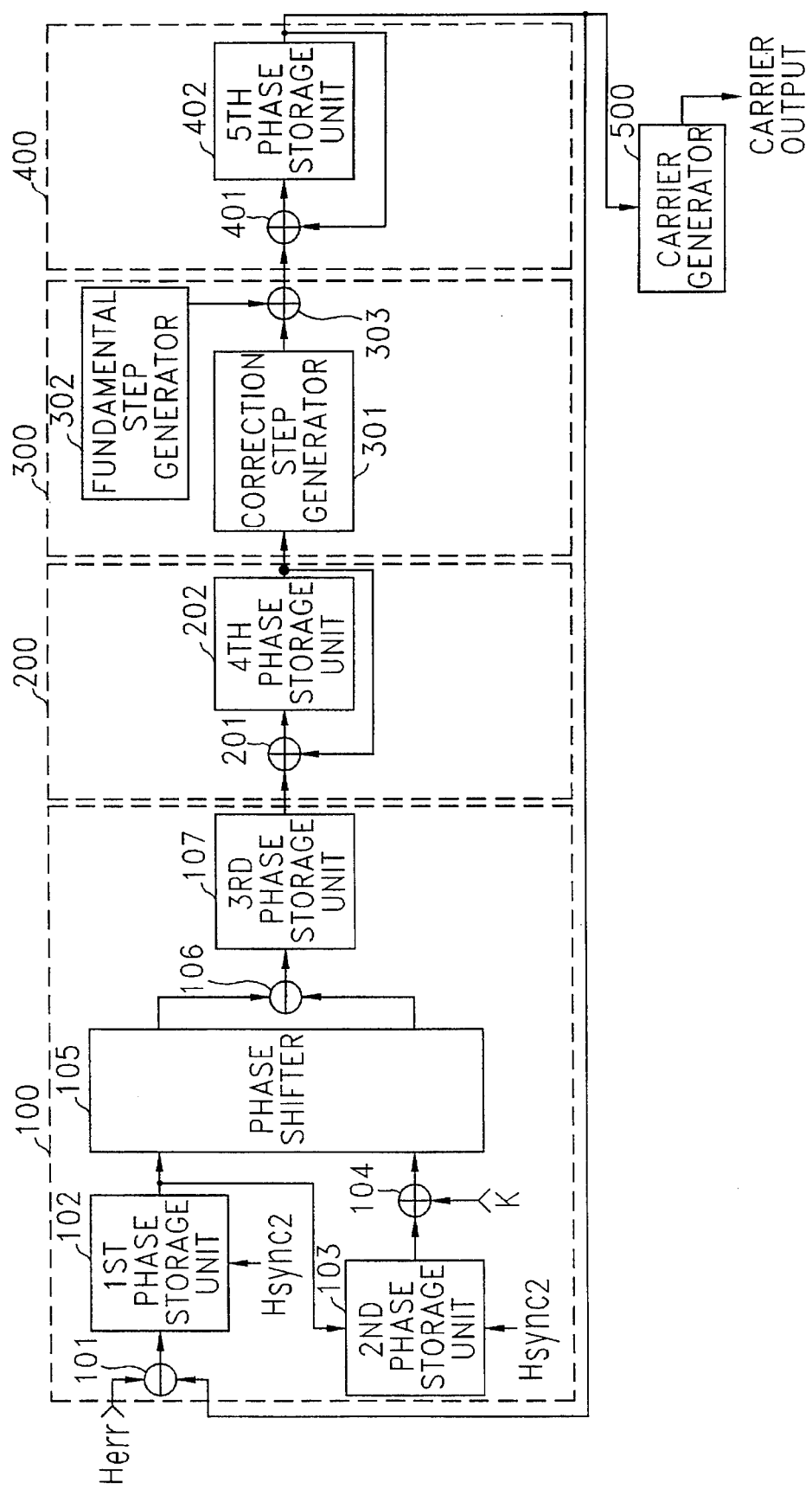
FIG. 2 is a block diagram of an automatic digital frequency control circuit according to the present invention.

An apparatus considering such an error value of a digital horizontal sync signal is shown in FIG. 2, in which a block diagram of an automatic digital frequency control circuit according to one preferred embodiment of the present invention is shown. In FIG. 2, a phase difference calculator 100 receives an error value $H_{err}$ of a digital horizontal sync signal and a phase value supplied from a phase value generator 400, and then generates a phase difference value between the two lines. A phase difference accumulator 200 adds a phase difference accumulated value for a previous line to a current phase difference value and then generates a new phase difference accumulated value. An oscillation step corrector 300 generates correction step data corresponding to a new phase difference accumulated value, and adds the generated new phase difference accumulated value to fundamental oscillation step data, in such a manner that corrected oscillation step data is generated. A phase value generator 400 receives the corrected oscillation step data and generates a new phase value using a stored phase value whenever a system clock is generated. A carrier generator 500 includes a look-up table and outputs a function value of a sine waveform or a cosine waveform according to a phase value applied from phase value generator 400, in such a way that carriers having various frequencies are advantageously generated.

Prior to describing the operation of the FIG. 2 apparatus, a digital horizontal sync signal error value $H_{err}$ applied to phase difference calculator 100 will be described below with reference to FIGS. 3A through 3E.

FIG. 3A shows a luminance signal Y, while FIG. 3B shows an enlarged horizontal sync signal H-SYNC included in luminance signal Y. If a sampling clock shown in FIG. 3C exactly coincides with a separation reference signal SL of the horizontal sync signal, an ideal analog horizontal sync signal $H_{SYNC1}$, shown in FIG. 3E, can be obtained. However, since the sampling clock is difficult to control so that it coincides with the separation reference value SL, a digital horizontal sync signal $H_{SYNC2}$ of FIG. 3D, which is actually obtained by approximately sampling has an error value $H_{err}$ of ±0.5 clocks with respect to the analog horizontal sync signal shown in FIG. 3E. Assuming that an inclined portion of a horizontal sync signal H-SYNC is linear, such a digital horizontal sync signal error value $H_{err}$ can be obtained by using separation reference value SL of the horizontal sync signal and two sample data S1 and S2, located before and after the separation value SL. Since a difference value S1–S2 between the samples corresponds to one period of time T, difference SL–S2 between separation reference value SL and sample data S2 on the horizontal sync signal becomes proportional to the digital horizontal sync signal error value $H_{err}$. Thus, from an equation of T: S1–S2=$H_{err}$: SL–S2, the value of $H_{err}$ becomes [(SL –S2)/(S1–S2)]×T.

Returning to FIG. 2, when digital horizontal sync signal error value $H_{err}$ of the current scanning line and the phase value of phase value generator 400 are applied to phase difference calculator 100, first phase corrector 101 (adds) combines the two input data with each other, and generates a phase value which is obtained by correcting a phase error generated when a digital horizontal sync signal is obtained by sampling an analog horizontal sync signal.

The output of first phase corrector 101 is supplied to a first phase storage unit 102. First phase storage unit 102 and a second phase storage unit 103 serially connected thereto latch the input data, respectively. First phase storage unit 102 and second phase storage unit 103 latch the data input responsive to digital horizontal sync signal $H_{SYNC2}$, which was discussed in connection with FIG. 3D. Thus, first phase storage unit 102 stores a corrected phase value corresponding to a digital horizontal sync signal $H_{SYNC2}$ which is currently applied thereto. Second phase storage unit 103 stores a corrected phase value corresponding to a digital horizontal sync signal $H_{SYNC2}$ at the preceding line, which is applied from first phase storage unit 102. Phase storage units 102 and 103 can be advantageously formed from latches.

The corrected phase value of the preceding line which is output from second phase storage unit 103 is input to a second phase corrector 104. Second phase corrector 104 adds a delayed phase value K to the previous line corrected phase value to remove a phase delay between the lines. In case of the 8 mm system, an ideal low-band carrier has a phase difference of a quarter period of time (90°) every horizontal sync line (1 H). Thus, the low-band carrier becomes in-phase every four lines. In case of the VHS system, the low-band carrier signal has a phase difference of zero between the lines. In case of the 8 mm system, second phase corrector 104 adds a delayed phase value K, e.g., $2^n/4$ to the input previous line corrected phase value to remove a phase delay of 90° between the lines, and supplies a phase-corrected phase value of the preceding line to a phase shifter 105. Here, n is the number of address bits of a look-up table, which will be described in greater detail below. Phase shifter 105 shifts the difference between the phase value applied from first phase storage unit 102 and the phase value output from second phase corrector 104, so as to easily calculate the difference therebetween. For example, phase shifter 105 shifts each of the two phase values into the middle for easier comparison, in an exemplary case where the two phase values are placed at either end of the respective addresses.

A first operation unit 106 receives the phase values of two lines, as processed above, subtracts the received phase values from another, and generates a phase difference value with respect to two phase values. The phase difference value is supplied to and then stored in a third phase storage unit 107.

Phase difference accumulator 200 advantageously includes a second operator 201, which is connected to the output of third phase storage unit 107, and a fourth phase storage unit 202, for storing the output of second operator 201 and for supplying the stored data to the second operator 201. Second operator 201 adds the phase difference value supplied from third storage unit 107 to the phase difference accumulation value for the preceding line, which is output from fourth phase storage unit 202, to obtain a new phase difference accumulation value. The newly obtained phase difference accumulation value is stored in fourth phase storage unit 202. That is, fourth phase storage unit 202 stores the input phase difference accumulation value as the new phase difference accumulation value of the next scanning line.

Oscillation step corrector 300 preferably includes a correction step generator 301 for receiving the phase difference accumulation value from fourth phase storage unit 202 and generating correction step data, a fundamental step generator 302 for generating fundamental oscillation step data, and a third operator 303 for adding the outputs of the two step generators 301 and 302. When the phase difference accumulation value output from fourth phase storage unit 202 is applied to correction step generator 301, correction step data corresponding to the input phase difference accumulation value is generated in correction step generator 301 using the following equation:

Correction step data=$[2^n/(f_s/f_H)]\times$[Phase Error Value]$\times$[Tracing Velocity]

Here, n is the number of addresses of a look-up table, $f_s$ is a sampling frequency, $f_H$ is a horizontal sync signal frequency, and the tracing velocity represents a degree of making the phase of the carrier coincide with the horizontal sync signal, respectively. The tracing velocity preferably has a value between zero and one. When the tracing velocity is zero, the automatic frequency control circuit is turned off, while when the former is one, the latter has a maximum tracing velocity. The correction step data output from correction step generator 301 is supplied to third operator 303.

At this time, the fundamental oscillation step data generated from fundamental step generator 302 is also applied to third operator 303. Fundamental step generator 302 generates the fundamental oscillation step using the following equation:

Fundamental oscillation step=$(2^n \times f_{car}/f_s)$

Here, $f_{car}$ is a low-band carrier frequency, which is 743KHz for the 8 mm system, but which is 629KHz for the VHS system.

Third operator 303 adds the correction step data to the fundamental oscillation step data to produce corrected oscillation step data, which is then advantageously supplied to phase value generator 400.

Phase value generator 400 preferably can include a fourth operator 401 for generating an accumulated phase value on the basis of the corrected oscillation step data, and a fifth phase storage unit 402 for storing the phase value output from fourth operator 401 and outputting the stored phase value for fourth operator 401. When a system clock (not shown) is applied to fourth operator 401, the phase value applied from fifth phase storage unit 402 is increased by the corrected oscillation step data, and the increased phase value is then supplied to fifth phase storage unit 402. Fifth phase storage unit 402 latches the phase value applied from fourth operator 401. This operation is continuously performed whenever the system clock is applied thereto. The phase value latched in fifth phase storage unit 402 is supplied to first phase corrector 101 of phase difference calculator 100. It will be appreciated that phase value generator 400 generates a new phase value whenever the system clock is applied to thereto. First phase storage unit 102 stores data which is applied from phase value generator 400 only when horizontal sync signal $H_{SYNC2}$ is applied thereto. Thus, phase storage units 102 and 103 store only one phase value with respect to each scanning line, respectively.

On the other hand, carrier generator 500 receives the phase value output from fifth phase storage unit 402 as address data for an internal look-up table, and then generates a carrier having a frequency corresponding to the input phase value. The look-up table has an address of 0 through $2^n$. Advantageously, such an address becomes a phase value (0° through 360°) of one period of time for a sine waveform or a cosine waveform.

It will also be appreciated that while the automatic digital frequency control circuit according to the present invention does not use a voltage controlled oscillator which is a limiting factor when making the digital system, it can generate a carrier which is synchronized to a horizontal sync signal. Thus, the present invention advantageously can provide a simple and compact automatic digital frequency control circuit having excellent performance.

Other modifications and variations to the invention will be apparent to those skilled in the art from the foregoing disclosure and teachings. Thus, while only certain embodiments of the invention have been specifically described herein, it will be apparent that numerous modifications may be made thereto without departing from the spirit and scope of the invention.

What is claimed is:

1. An automatic digital frequency control circuit for generating a carrier which is synchronized to a digital horizontal sync signal, said automatic digital frequency control circuit comprising:

a phase difference calculator for calculating and providing a phase difference signal between two adjacent scanning lines in response to an error value representative of an error between digital horizontal sync signal with respect to a present scanning line and a phase value of a previous scanning line;

a phase difference accumulator receiving the phase difference signal for combining the received phase difference signal with a phase difference accumulated value, which has been already stored in said accumulator so as to permit output of a new phase difference accumulated value as the result of an accumulation operation;

an oscillation step corrector generating fundamental oscillation step data, generating correction step data correcting the fundamental oscillation according to the phase difference accumulated value supplied from said phase difference accumulator by using correction step data, thereby generating the corrected oscillation step data;

a phase value generator receiving the corrected oscillation step data, increasing a phase value, which has been already stored responsive to said corrected oscillation data, generating a plurality of phase values for carrier generation with respect to the present scanning line, and supplying respective generated phase values to said phase difference calculator; and a carrier generator generating a carrier having a frequency corresponding to each of said respective phase value generated from said phase value generator.

2. The automatic digital frequency control circuit according to claim 1, wherein said phase difference calculator comprises:

a first phase corrector for combining the phase value supplied from said phase value generator with a digital horizontal sync signal error value representing a phase value obtained by correcting a phase error generated when a digital horizontal sync signal is obtained by sampling an analog horizontal sync signal;

a first phase storage unit latching a corrected phase value output from said first phase corrector in response to the digital horizontal sync signal;

a second phase storage unit receiving a respective latched corrected phase value output from said first phase storage unit for latching a previous corrected phase value of a respective preceding scanning line in response to the digital horizontal sync signal; and a first operator receiving the latched and the previous corrected phase values supplied from said first and second phase storage units for generating the phase difference value.

3. The automatic digital frequency control circuit according to claim 2, wherein said phase difference calculator further comprises a second phase corrector operatively connected to said first operator for adding a phase delay value between respective scanning lines to the previous corrected phase value of said preceding scanning line supplied from said second phase storage unit, thereby generating a precision corrected previous phase value wherein the respective phase difference between the scanning lines is corrected.

4. The automatic digital frequency control circuit according to claim 3, wherein said second phase corrector adds a phase delay value of 90° to the previous corrected phase value of said preceding scanning line and wherein said second phase corrector is operative in an 8 mm system.

5. The automatic digital frequency control circuit according to claim 3, wherein said second phase corrector adds a phase delay value of 0° to the previous corrected phase value of the preceding scanning line and wherein said second phase corrector is operative in a VHS system.

6. The automatic digital frequency control circuit according to claim 1, wherein said phase difference accumulator comprises:

a first operator for combining the phase difference value supplied from said phase difference calculator with the phase difference accumulation value of the respective preceding line thereby generating said new phase difference accumulation value; and a first phase storage unit for supplying the new phase difference accumulation value of the respective preceding line and for storing the respective new phase difference accumulation value generated by said second operator for a current line.

7. The automatic digital frequency control circuit according to claim 1, wherein said oscillation step corrector comprises: a correction step generator for generating said correction step data in response to the new phase difference accumulation value from said phase difference accumulator:

a fundamental step generator for generating said fundamental oscillation step data; and a first operator for adding the outputs of said correction and said fundamental step generators thereby generating corrected oscillation step data supplied to said phase value generator.

8. The automatic digital frequency control circuit according to claim 7, wherein said correction step data satisfies the following equation:

Correction step data=$[2^n/(f_s/f_H)]\times$[Phase Error Value]$\times$[Tracing Velocity]

where n is the number of data supplied to said carrier generator, $f_s$ is a sampling frequency, $f_H$ is a horizontal sync signal frequency, and tracing velocity represents a degree of making the phase of the carrier coincide with an associated horizontal sync signal, respectively, the tracing velocity having a value of zero through one.

9. The automatic digital frequency control circuit according to claim 7, wherein said fundamental oscillation step data satisfies the following equation:

Fundamental oscillation step=$(2^n \times f_{car}/f_s)$ where n is the number of data supplied to said carrier generator, $f_{car}$ is a low-band carrier frequency, and $f_s$ is a sampling frequency.

10. The automatic digital frequency control circuit according to claim 1, wherein said phase value generator comprises:

a first operator for increasing phase value feedback whenever a system clock signal is applied thereto responsive to said corrected oscillation step data supplied by said oscillation step corrector so as to output an increased phase value; and a first phase storage unit receiving the increased phase value from said first operator and latching the increased phase value output from said first operator according to the system clock signal.

11. The automatic digital frequency control circuit according to claim 1, wherein said carrier generator comprises a look-up table for receiving the phase values supplied from said phase value generator as address data, thereby generating a carrier having a frequency corresponding to said address data.

12. An automatic digital frequency control circuit for generating a carrier which is synchronized to a digital horizontal sync signal, said automatic digital frequency control circuit comprising:

phase difference calculating means for calculating and providing a phase difference signal between two adjacent scanning lines in response to an error value representative of an error between digital horizontal sync signal with respect to a present scanning line and a phase value of a previous scanning line;

phase difference accumulating means receiving the phase difference signal for combining the received phase difference signal with a phase difference accumulated value so as to permit output of a new phase difference accumulated value as the result of an accumulation operation;

oscillation step correcting means for generating fundamental oscillation step data, for generating correction step data for correcting the fundamental oscillation according to said new phase difference accumulated value by using correction step data, and for generating a corrected oscillation step data;

phase value generating means receiving the corrected oscillation step data, for increasing a phase value, which has been already stored responsive to said corrected oscillation data, for generating a plurality of phase values for carrier generation with respect to the present scanning line, and for supplying respective generated phase values to said phase difference calculating means; and carrier generating means for generating a carrier having a frequency corresponding to each of said respective phase value generated from said phase value generating means.

13. The automatic digital frequency control circuit according to claim 12, wherein said phase difference calculating means comprises:

first phase correcting means for combining the phase value supplied from said phase value generating means with a digital horizontal sync signal error value representing a phase value obtained by correcting a phase error generated when a digital horizontal sync signal is obtained by sampling an analog horizontal sync signal;

first phase storage means for latching a corrected phase value output from said first phase correcting means in response to the digital horizontal sync signal;

second phase storage means receiving a respective latched corrected phase value output from said first phase storage means for latching a previous corrected phase value of a respective preceding scanning line in response to the digital horizontal sync signal; and first operating means receiving the latched and the previous corrected phase values supplied from said first and second phase storage means for generating the phase difference value.

14. The automatic digital frequency control circuit according to claim 13, wherein said phase difference calculating means further comprises a second phase correcting means operatively connected to said first operating means for adding a phase delay value between respective scanning lines to the previous corrected phase value of said preceding scanning line supplied from said second phase storage means, thereby generating a precision corrected previous phase value wherein the respective phase difference between the scanning lines is corrected.

15. The automatic digital frequency control circuit according to claim 12, wherein said phase difference accumulating means comprises:

first operating means for combining the phase difference value supplied from said phase difference calculating means with the phase difference accumulation value of the respective preceding line thereby generating said new phase difference accumulation value; and first phase storage means for supplying the new phase difference accumulation value of the respective preceding line and for storing the respective new phase difference accumulation value generated by said first operating means for a current line.

16. The automatic digital frequency control circuit according to claim 12, wherein said oscillation step correcting means comprises:

correction step generating means for generating said correction step data in response to the new phase difference accumulation value from said phase difference accumulating means:

fundamental step generating means for generating said fundamental oscillation step data; and first operating means for adding the outputs of said correction and said fundamental step generating means thereby generating corrected oscillation step data supplied to said phase value generating means.

17. The automatic digital frequency control circuit according to claim 12, wherein said phase value generating means comprises:

first operating means for increasing phase value feedback whenever a system clock signal is applied thereto responsive to said corrected oscillation step data supplied by said oscillation step correcting means so as to output an increased phase value; and first phase storage means receiving the increased phase value from said first operating means for latching the increased phase value output from said first operating means according to the system clock signal.

18. The automatic digital frequency control circuit according to claim 12, wherein said carrier generating means comprises a look-up table receiving the phase values supplied from said phase value generating means as address data for generating a carrier having a frequency corresponding to said address data.

* * * * *